US012635380B2

(12) United States Patent
Son et al.

(10) Patent No.: US 12,635,380 B2
(45) Date of Patent: May 19, 2026

(54) ELECTRONIC APPARATUS HAVING A SENSING UNIT WITH INCREASED SENSITIVITY AND RELIABILITY

(71) Applicant: SAMSUNG DISPLAY CO., LTD., Yongin-si (KR)

(72) Inventors: Sunkwun Son, Yongin-si (KR); Dong Hee Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 515 days.

(21) Appl. No.: 18/344,301

(22) Filed: Jun. 29, 2023

(65) Prior Publication Data

US 2024/0081125 A1     Mar. 7, 2024

(30) Foreign Application Priority Data

Sep. 5, 2022    (KR) ........................ 10-2022-0111775

(51) Int. Cl.
| | |
|---|---|
| *H10K 59/40* | (2023.01) |
| *H10K 50/844* | (2023.01) |
| *H10K 59/126* | (2023.01) |
| *H10K 59/131* | (2023.01) |
| *H10K 102/00* | (2023.01) |

(52) U.S. Cl.
CPC ........... *H10K 59/40* (2023.02); *H10K 50/844* (2023.02); *H10K 59/126* (2023.02); *H10K 59/131* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 9,158,419 B2 | 10/2015 | Kim | |
| 9,553,134 B2 | 1/2017 | Nam et al. | |
| 10,499,508 B2 | 12/2019 | Ahn et al. | |
| 10,744,600 B2 | 8/2020 | Fujisawa et al. | |
| 2017/0287394 A1 * | 10/2017 | Kim ..................... | H10K 59/131 |
| 2020/0401274 A1 | 12/2020 | Moon et al. | |

FOREIGN PATENT DOCUMENTS

| | | |
|---|---|---|
| KR | 10-1706232 | 2/2017 |
| KR | 10-1877084 | 7/2018 |
| KR | 10-2178796 | 11/2020 |
| KR | 10-2020-0145922 | 12/2020 |
| KR | 10-2298370 | 9/2021 |

* cited by examiner

*Primary Examiner* — Kyoung Lee
(74) *Attorney, Agent, or Firm* — F. CHAU & ASSOCIATES, LLC

(57) ABSTRACT

An electronic apparatus includes a base substrate including a first base area, a bending area, a second base area, and a pad area arranged in one direction, a plurality of pixels disposed in the first base area, each pixel including a transistor and a light emitting element, an encapsulation layer covering the light emitting element and spaced apart from the bending area and the second base area, a plurality of sensing electrodes disposed on the encapsulation layer, a plurality of sensing lines, each electrically connected to one of the sensing electrodes, and a shield electrode disposed on a same layer as the light emitting element and extending from the first base area toward the second base area. The shield electrode overlaps the sensing lines in the bending area and the second base area.

20 Claims, 8 Drawing Sheets

TEX: TEX1~TEX6
TEY: TEY1~TEY4

ELECTRONIC APPARATUS HAVING A SENSING UNIT WITH INCREASED SENSITIVITY AND RELIABILITY

CROSS-REFERENCE TO RELATED APPLICATIONS

This U.S. non-provisional patent application claims priority under 35 U.S.C. § 119 to Korean Patent Application No. 10-2022-0111775, filed on Sep. 5, 2022, the disclosure of which is incorporated by reference herein in its entirety.

TECHNICAL FIELD

Embodiments of the inventive concept relate to an electronic apparatus capable of displaying an image and sensing an external input.

DISCUSSION OF RELATED ART

Multimedia electronic apparatuses such as televisions, mobile phones, tablets, navigation devices, and game machines may include electronic elements that perform various functions, such as a display unit that displays an image and a sensing unit that senses an external input. The electronic elements may be electrically connected to a circuit board through signal lines that transmit electrical signals.

As the degree of integration of electronic elements increases, the number of signal lines may increase, and an electronic apparatus may include a predetermined area for arranging the signal lines. In addition, as the signal lines overlap each other within a limited area, electrical signals transmitted to the signal lines may affect each other and generate noise.

SUMMARY

Embodiments of the inventive concept provide an electronic apparatus having a sensing unit with increased sensitivity and reliability, in which noise may be prevented from being generated in sensing lines using a shield electrode. The sensing lines may be arranged to have an iso-resistance.

An embodiment of the inventive concept provides an electronic apparatus including: a base substrate including a first base area, a bending area, a second base area, and a pad area arranged in one direction; a plurality of pixels disposed in the first base area, each pixel including a transistor and a light emitting element; an encapsulation layer covering the light emitting element and spaced apart from the bending area and the second base area; a plurality of sensing electrodes disposed on the encapsulation layer; a plurality of sensing lines, each electrically connected to one of the sensing electrodes; and a shield electrode disposed on a same layer as the light emitting element and extending from the first base area toward the second base area. The shield electrode overlaps the sensing lines in the bending area and the second base area.

In an embodiment, the light emitting element may include a first electrode, a second electrode disposed on the first electrode, and a light emitting layer disposed between the first electrode and the second electrode. The shield electrode may include the same material as the first electrode or the second electrode.

In an embodiment, the shield electrode may be disposed on the same layer as the first electrode.

In an embodiment, the shield electrode may be connected to the second electrode in the first base area.

In an embodiment, the shield electrode may be formed integrally with the second electrode.

In an embodiment, the electronic apparatus may further include a plurality of signal lines electrically connected to the pixels. In a thickness direction of the electronic apparatus, the sensing lines may be spaced apart from the signal lines with the shield electrode disposed therebetween.

In an embodiment, the electronic apparatus may further include a power pattern disposed under the shield electrode and electrically connected to the pixels, and providing a voltage to the pixels.

In an embodiment, the shield electrode may be in contact with the power pattern in the first base area.

In an embodiment, a planar area of the shield electrode may be larger than a planar area of the power pattern in the second base area.

In an embodiment, at least one of the sensing lines does not overlap the power pattern in a plan view.

In an embodiment, the electronic apparatus may further include a plurality of sensing pads disposed in the pad area, each connected to one of the sensing lines. The sensing pads may be disposed on a same layer as the power pattern.

In an embodiment, the electronic apparatus may further include a circuit board disposed in the pad area and electrically connected to the sensing pads.

In an embodiment, the electronic apparatus may further include an insulating layer in contact with the encapsulation layer and the sensing electrodes. In a thickness direction of the electronic apparatus, the sensing lines are spaced apart from the shield electrode with the insulating layer disposed therebetween.

In an embodiment, the encapsulation layer may include a first inorganic film disposed on the light emitting element, an organic film disposed on the first inorganic film, and a second inorganic film disposed on the organic film. An end of the organic film may be spaced apart from the bending area.

In an embodiment, the electronic apparatus may further include a dam disposed in the first base area. In a plan view, the organic film may be spaced apart from the bending area with the dam disposed therebetween.

In an embodiment, the bending area may be bent around a bending axis extending along a direction crossing the one direction. The first base area may overlap the second base area in a plan view.

In an embodiment of the inventive concept, an electronic apparatus includes: a display unit configured to display an image; and a sensing unit disposed on the display unit and configured to sense an external input. The display unit includes: a base substrate including a first base area, a second base area overlapping the first base area in a plan view, and a bending area disposed between the first base area and the second base area; a light emitting element disposed in the first base area and including a first electrode, a light emitting layer, and a second electrode; an encapsulation layer covering the light emitting element; a shield electrode disposed on a same layer as the first electrode or the second electrode; and a power pattern disposed under the shield electrode and electrically connected to the second electrode and provide a voltage to the second electrode. The sensing unit includes at least one conductive layer disposed on the encapsulation layer and including sensing electrodes and sensing lines. The sensing lines overlap the shield electrode in the second base area. A planar area of the shield electrode is larger than a planar area of the power pattern on the second base area.

In an embodiment, the sensing unit may include: a base layer in contact with the encapsulation layer; a first conductive layer disposed on the base layer; a sensing insulating layer disposed on the first conductive layer; and a second conductive layer disposed on the sensing insulating layer. The second conductive layer includes the sensing lines.

In an embodiment, the shield electrode may be connected to the second electrode in the first base area.

In an embodiment, the encapsulation layer may include a first inorganic film disposed on the light emitting element, an organic film disposed on the first inorganic film, and a second inorganic film disposed on the organic film. Each of the first inorganic film, the organic film, and the second inorganic film may be spaced apart from the bending area and the second base area.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
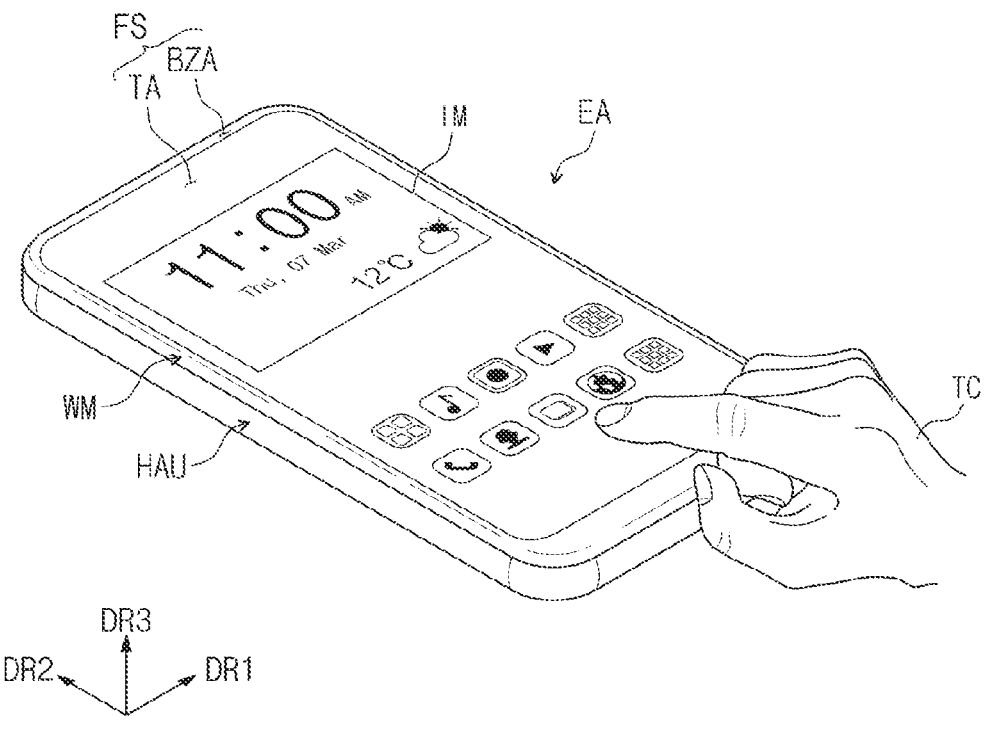
FIG. 1 is a perspective view of an electronic apparatus according to an embodiment of the inventive concept.

Embodiments of the inventive concept will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

As used herein, the term "and/or" includes any and all combinations of one or more of the associated listed items.

Expressions such as "at least one of," when preceding a list of elements, modify the entire list of elements and do not modify the individual elements of the list.

It will be understood that the terms "first," "second," "third," etc. are used herein to distinguish one element from another, and the elements are not limited by these terms. Thus, a "first" element in an embodiment may be described as a "second" element in another embodiment.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It should be understood that terms such as "comprise" or "have" are intended to designate that a feature, number, step, action, component, part, or combination thereof described in the specification is present, but do not preclude the possibility of additional or the existence of one or more other features or numbers, steps, operations, components, parts, or combinations thereof.

Hereinafter, an electronic apparatus according to embodiments of the inventive concept will be described with reference to the drawings.

Figure 2:
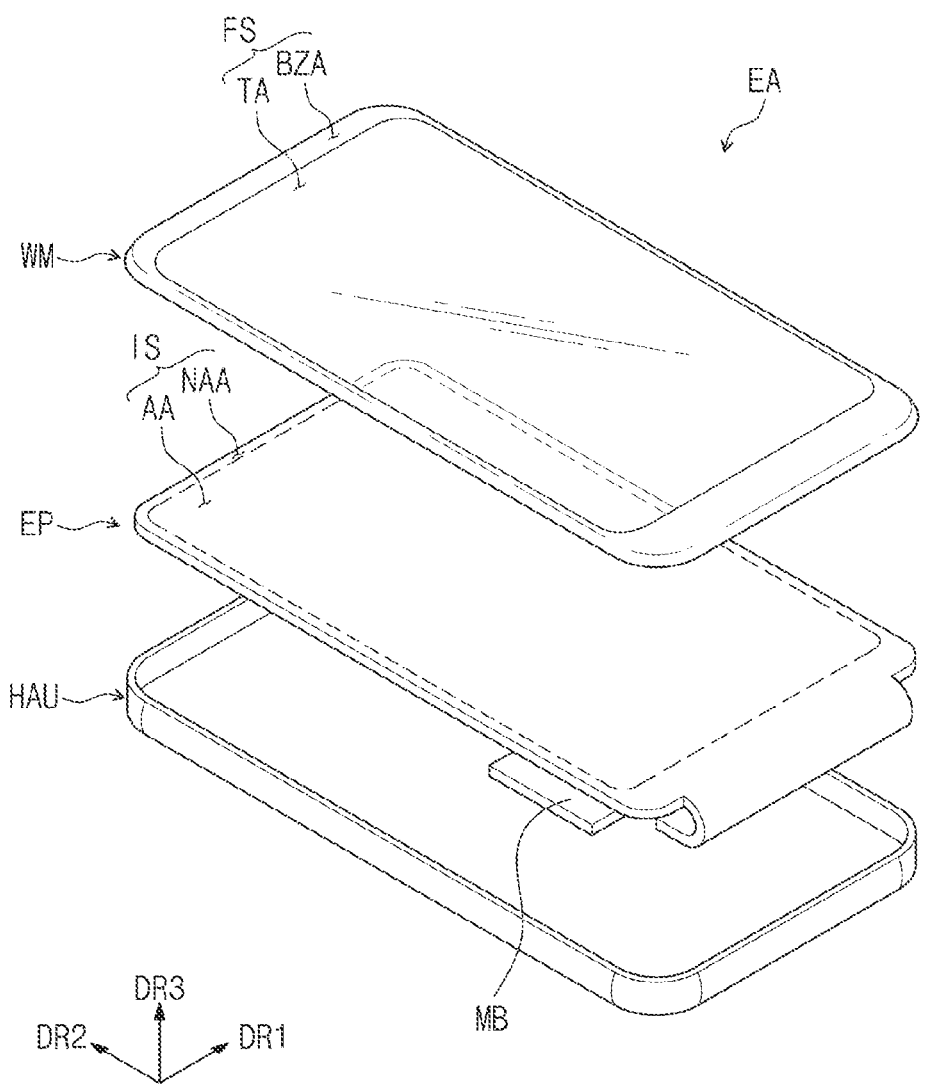
FIG. 2 is an exploded perspective view of an electronic apparatus according to an embodiment of the inventive concept.

FIG. 1 is a perspective view of an electronic apparatus EA according to an embodiment of the inventive concept. FIG. 2 is an exploded perspective view of an electronic apparatus EA according to an embodiment of the inventive concept.

Referring to FIGS. 1 and 2, the electronic apparatus EA may be a device that is activated according to an electrical signal, displays an image IM, and senses an external input TC. For example, the electronic apparatus EA may include devices such as a monitor, a mobile phone, a tablet, a navigation system, and a game machine. However, the electronic apparatus EA is not limited thereto. In an embodiment described herein, the electronic apparatus EA exemplifies a mobile phone.

The electronic apparatus EA may have a rectangular shape having short sides extending in a first direction DR1 and long sides extending in a second direction DR2 crossing the first direction DR1 in a plan view. However, embodiments of the inventive concept are not limited thereto, and the electronic apparatus EA may have various shapes such as, for example, a circle and a polygon in a plan view.

In an embodiment, a third direction DR3 may be defined as a direction perpendicular to a plane defined by the first direction DR1 and the second direction DR2. The front (or upper surface) and the rear (or lower surface) of each member constituting the electronic apparatus EA may be opposite to each other in the third direction DR3, and a normal direction of each of the front surface and the rear surface may be substantially parallel to the third direction DR3. A separation distance between the front surface and the rear surface defined along the third direction DR3 may correspond to a thickness of the member.

In the present specification, "in a plan view" may be defined as a state viewed from the third direction DR3. In this specification, "on the cross-section" may be defined as a state viewed from the first direction DR1 or the second direction DR2. Moreover, the directions indicated by the first to third directions DR1, DR2, and DR3 are relative concepts and may be converted to other directions.

The electronic apparatus EA may be rigid or flexible. "Flexible" refers to a property that may be bent, folded, or rolled, and may include everything from a completely foldable structure to a structure that may be bent to the level of several nanometers. For example, the flexible electronic apparatus EA may include a curved electronic apparatus or a foldable electronic apparatus.

The electronic apparatus EA may display the image IM through a display surface FS parallel to each of the first direction DR1 and the second direction DR2. The image IM may include a still image as well as a dynamic image. A clock and a plurality of icons are illustrated as an example of the image IM in FIG. 1. However, the image IM is not limited thereto.

The display surface FS of the electronic apparatus EA may include only a flat surface, or may further include a curved surface bent from at least one side of the flat surface. The display surface FS may correspond to the front surface of the electronic apparatus EA, and may correspond to the front surface of a window WM. Hereinafter, the same reference numerals are used for the display surface FS of the electronic apparatus EA and the front surface FS of the window WM.

The electronic apparatus EA according to an embodiment may sense the external input TC applied from outside of the electronic apparatus EA. The external input TC may include various types of inputs such as, for example, force, pressure, temperature, or light. In an embodiment, the external input TC is illustrated as a user's hand applied to the front surface of the electronic apparatus EA. However, this is illustrated by way of example, and the external input TC may include an input such as, for example, contact by a pen or an input applied close to the electronic apparatus EA such as hovering.

The electronic apparatus EA may sense (or detect) a user's input through the display surface FS defined on the front surface and respond to the sensed input signal. However, the area of the electronic apparatus EA sensing external input TC is not limited to the front surface of the electronic apparatus EA, and may be changed according to the design of the electronic apparatus EA. For example, the electronic apparatus EA may sense a user's input applied to the side or rear surface of the electronic apparatus EA.

The electronic apparatus EA may include the window WM, an electronic panel EP, and a housing HAU. The window WM and the housing HAU may be combined to form the appearance of the electronic apparatus EA.

The window WM may be disposed on the electronic panel EP. The window WM may cover a front surface IS of the electronic panel EP, and may protect the electronic panel EP from external impacts and scratches. The window WM may be coupled to the electronic panel EP through an adhesive layer.

The window WM may include an optically transparent insulating material. For example, the window WM may include glass or a synthetic resin as a base film. The window WM may have a single-layered or multi-layered structure. For example, the window WM having the multi-layer structure may include plastic films bonded with an adhesive, or a glass film and a plastic film bonded with an adhesive. The window WM may further include a functional layer such as, for example, an anti-fingerprint layer, a phase control layer, and/or a hard coating layer disposed on the base film.

The front surface FS of the window WM may correspond to the front surface of the electronic apparatus EA as described above. The front surface FS of the window WM may include a transmissive area TA and a bezel area BZA.

The transmissive area TA may be an optically transparent area. The transmissive area TA may transmit the image IM provided by the electronic panel EP. In an embodiment, the transmissive area TA is shown in a rectangular shape, but embodiments of the inventive concept are not limited thereto, and the transmissive area TA may have various shapes.

The bezel area BZA may be an area having low light transmittance compared to the transmissive area TA. The bezel area BZA may correspond to an area on which a material having a predetermined color is printed. The bezel area BZA may prevent light from being transmitted, and thus, one configuration of the electronic panel EP overlapping the bezel area BZA may be prevented from being visually recognized by a user.

The bezel area BZA may be adjacent to the transmissive area TA. The shape of the transmissive area TA may be substantially defined by the bezel area BZA. For example, the bezel area BZA may be disposed outside the transmissive area TA to surround the transmissive area TA. However, this is illustrated by way of example, and the bezel area BZA may be adjacent to only one side of the transmissive area TA or may be disposed on the side of the electronic apparatus EA instead of the front surface according to embodiments. According to embodiments, the bezel area BZA may be omitted.

The electronic panel EP may be disposed between the window WM and the housing HAU. The electronic panel EP may display the image IM and sense the external input TC. The image IM may be displayed on the front surface IS of the electronic panel EP. The front surface IS of the electronic panel EP may include an active area AA and a peripheral area NAA.

The active area AA may be an area activated according to an electrical signal. For example, the active area AA may be an area in which the image IM is displayed and an area in which the external input TC is sensed at the same time. The active area AA may overlap at least a part of the transmissive area TA. Accordingly, the user may visually recognize the image IM through the transmissive area TA or provide the external input TC. However, this is only an example, and embodiments of the inventive concept are not limited thereto. For example, according to embodiments, an area in which an image IM is displayed and an area in which an external input TC is sensed in the active area AA may be separated from each other.

The peripheral area NAA may be adjacent to the active area AA. For example, the peripheral area NAA may surround the active area AA. A driving circuit or a driving wire that drives the active area AA may be disposed in the peripheral area NAA. The peripheral area NAA may overlap at least a part of the bezel area BZA, and components disposed in the peripheral area NAA may be prevented from being viewed by the user by the bezel area BZA.

The electronic panel EP may include a display unit and a sensing unit. The display unit may display the image IM, and the sensing unit may sense the external input TC. A detailed description thereof is provided below.

A portion of the electronic panel EP may be bent about a bending axis extending in the first direction DR1. That is, the part of the electronic panel EP may be bent toward the rear surface of the electronic panel EP corresponding to the active area AA. A circuit board MB may be connected to a portion of the bent electronic panel EP, and accordingly, the circuit board MB may overlap the electronic panel EP in a plan view.

The circuit board MB may be electrically connected to the electronic panel EP at one side of the electronic panel EP. The circuit board MB may generate an electrical signal provided to the electronic panel EP, or receive a signal generated from the electronic panel EP, and may calculate a result value including information on a position or intensity detected by the external input TC.

The housing HAU may be coupled to the window WM, and thus, may provide an internal space accommodating the electronic panel EP and the circuit board MB. The housing HAU may include a material having relatively high rigidity. For example, the housing HAU may include a plurality of frames and/or plates made of glass, plastic, or metal, or a combination thereof. The housing HAU may absorb an external shock, and/or prevent or reduce foreign substances/moisture penetrating the electronic apparatus EA from outside of the electronic apparatus EA, thereby protecting the components of the electronic apparatus EA accommodated in the housing HAU.

Figure 3:
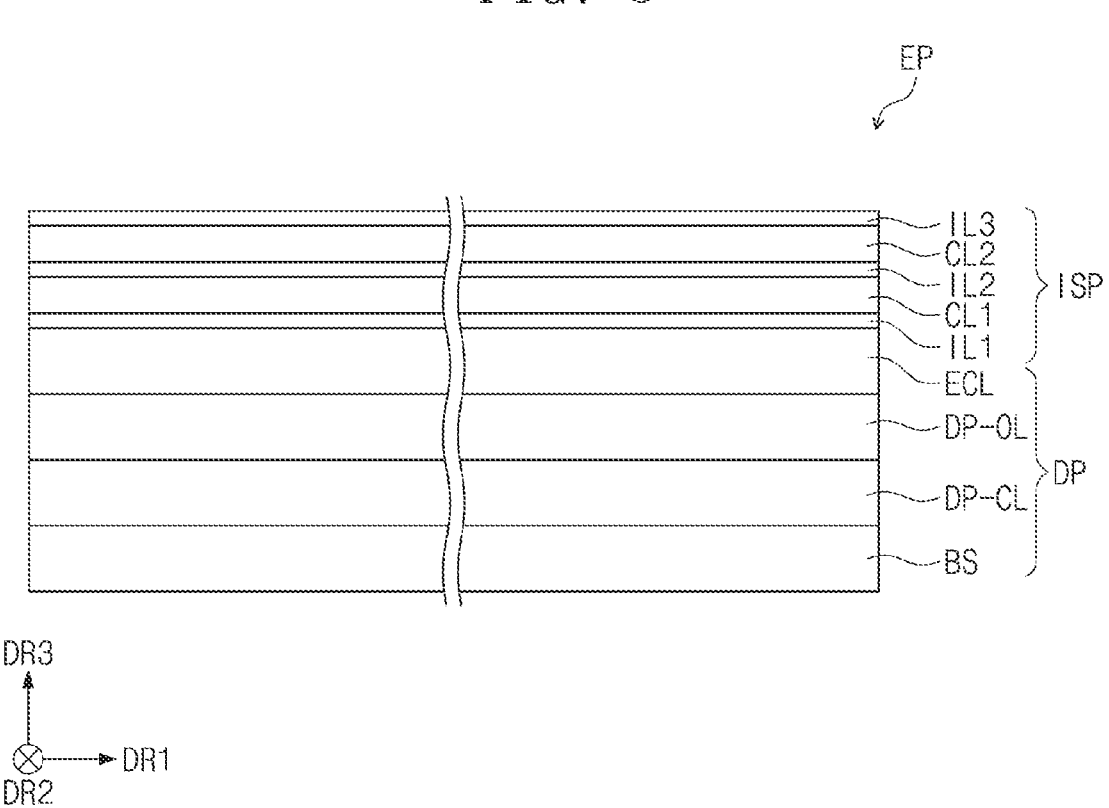
FIG. 3 is a cross-sectional view of an electronic panel according to an embodiment of the inventive concept.

FIG. 3 is a cross-sectional view of an electronic panel EP according to an embodiment of the inventive concept.

Referring to FIG. 3, the electronic panel EP may include a display unit DP and a sensing unit ISP. The sensing unit ISP may be disposed on the display unit DP. For example, the sensing unit ISP may be directly disposed on the display unit DP. In an embodiment, "a sensing unit ISP is directly disposed on the display unit DP." means that the sensing unit ISP is formed on the display unit DP through a continuous process, so that the sensing unit ISP and the display unit DP are coupled without a separate adhesive layer. That is, the components of the sensing unit ISP may be formed on the base surface provided by the display unit DP.

The display unit DP may display an image according to an electrical signal. The display unit DP according to an embodiment may be a light emitting display panel, but is not particularly limited thereto. For example, the display unit DP may be an organic light emitting display panel, an inorganic light emitting display panel, or a quantum dot light emitting display panel. Thus, the display unit DP may also be referred to herein as a display panel. The light emitting layer of the organic light emitting display panel may include an organic light emitting material, and the light emitting layer of the inorganic light emitting display panel may include an inorganic light emitting material. The light emitting layer of the quantum dot light emitting display panel may include a quantum dot and a quantum rod. Hereinafter, the display unit DP will be described as an organic light emitting display panel.

The display unit DP may include a base substrate BS, a circuit layer DP-CL, a display element layer DP-OL, and an encapsulation layer ECL sequentially stacked in the third direction DR3.

The base substrate BS may be a rigid substrate or a flexible substrate capable of bending, folding, or rolling. For example, the base substrate BS may be a glass substrate, a metal substrate, or a polymer substrate. The base substrate BS may provide a base surface on which the circuit layers DP-CL are disposed.

The base substrate BS may have a single-layer or multilayer structure. The base substrate BS may include, for example, an inorganic layer, an organic layer, or a composite material layer. For example, the base substrate BS having a multilayer structure may include synthetic resin layers and a multi- or single-layer inorganic layer disposed between the synthetic resin layers. The synthetic resin layer may include, for example, an acrylic resin, methacrylic resin, polyisoprene, vinyl resin, epoxy resin, urethane resin, cellulose resin, siloxane resin, polyamide resin, or perylene resin, but the material of the synthetic resin layer is not limited thereto.

The circuit layer DP-CL may be disposed on the base substrate BS. The circuit layer DP-CL may include at least one of an insulating layer, a semiconductor pattern, and/or a conductive pattern. The insulating layer, the semiconductor pattern, and the conductive pattern included in the circuit layer DP-CL may form driving elements such as, for example, transistors, signal lines, and pads.

The display element layer DP-OL may be disposed on the circuit layer DP-CL. The display element layer DP-OL may include light emitting elements that each emit light. For example, the light emitting elements may include an organic light emitting element, an inorganic light emitting element, a micro light emitting diode (LED), or a nano light emitting diode (LED). The light emitting elements of the display element layer DP-OL may be electrically connected to driving elements of the circuit layer DP-CL, and may emit light according to electrical signals provided by the driving elements.

The encapsulation layer ECL may be disposed on the display element layer DP-OL and may encapsulate the light emitting elements. The encapsulation layer ECL may include at least one thin film, which may increase optical efficiency of the display element layer DP-OL and/or may protect the display element layer DP-OL. For example, the encapsulation layer ECL may include at least one of an inorganic film and/or an organic film. The inorganic film of the encapsulation layer ECL may protect the light emitting elements from moisture/oxygen. The organic film of the encapsulation layer ECL may protect the light emitting elements from foreign matter such as, for example, dust particles.

The detection unit ISP may detect an external input and provide an input signal including information about the external input so that the display unit DP may display an image corresponding to the external input. The detection unit ISP may be driven in various ways, such as, for example, a capacitive method, a resistive film method, an infrared method, a sonic method, or a pressure method. However, the driving method of the detection unit ISP is not limited thereto, and may include, for example, any method that may detect an external input. In an embodiment, the detection unit ISP is described as an input detection panel driven in a capacitive manner.

The sensing unit ISP may include a base layer ILL a first conductive layer CL1, a first sensing insulating layer IL2, a second conductive layer CL2, and a second sensing insulating layer IL3 sequentially stacked along the third direction DR3. The base layer IL1 of the sensing unit ISP may contact the encapsulation layer ECL. However, embodiments are not limited thereto, and at least one of the base layer IL1 and/or the second sensing insulating layer IL3 may be omitted.

Each of the first conductive layer CL1 and the second conductive layer CL2 may have a single-layer or multi-layer structure. The multi-layered conductive layer may include at least two or more of transparent conductive layers and metal layers. The multi-layered conductive layer may include metal layers including different metals. The transparent conductive layer may include at least one of, for example, indium tin oxide (ITO), indium zinc oxide (IZO), zinc oxide (ZnO), indium tin zinc oxide (ITZO), PEDOT, metal nanowires, and/or graphene. The metal layer may include at least one of, for example, molybdenum, silver, titanium, copper, aluminum, and/or alloys thereof. For example, each of the first conductive layer CL1 and the second conductive layer CL2 has a two-layer structure, for example, a two-layer structure of ITO/copper, but is not limited thereto, and may have a three-layer structure of titanium/aluminum/titanium.

Each of the first conductive layer CL1 and the second conductive layer CL2 may include conductive patterns. The conductive patterns of the first conductive layer CL1 and the second conductive layer CL2 may form sensing electrodes constituting the sensing unit ISP and sensing lines connected sensing electrodes.

Each of the base layer IL1, the first sensing insulating layer IL2, and the second sensing insulating layer IL3 may include at least one of an inorganic film and/or an organic film. For example, the inorganic film may include at least one of aluminum oxide, titanium oxide, silicon oxide, silicon oxynitride, zirconium oxide, and/or hafnium oxide, and the organic film may include at least one of acrylic resins, methacrylic resins, polyisoprene, vinyl resins, epoxy resins, urethane resins, cellulose resins, siloxane resins, polyimide resins, polyamide resins, and/or perylene resins. However, the materials of the inorganic film and the organic film are not limited to the above examples. In an embodiment, the base layer IL1 may include an inorganic film, and the first sensing insulating layer IL2 and the second sensing insulating layer IL3 may include an organic film, but embodiments are not limited thereto.

Figure 4:
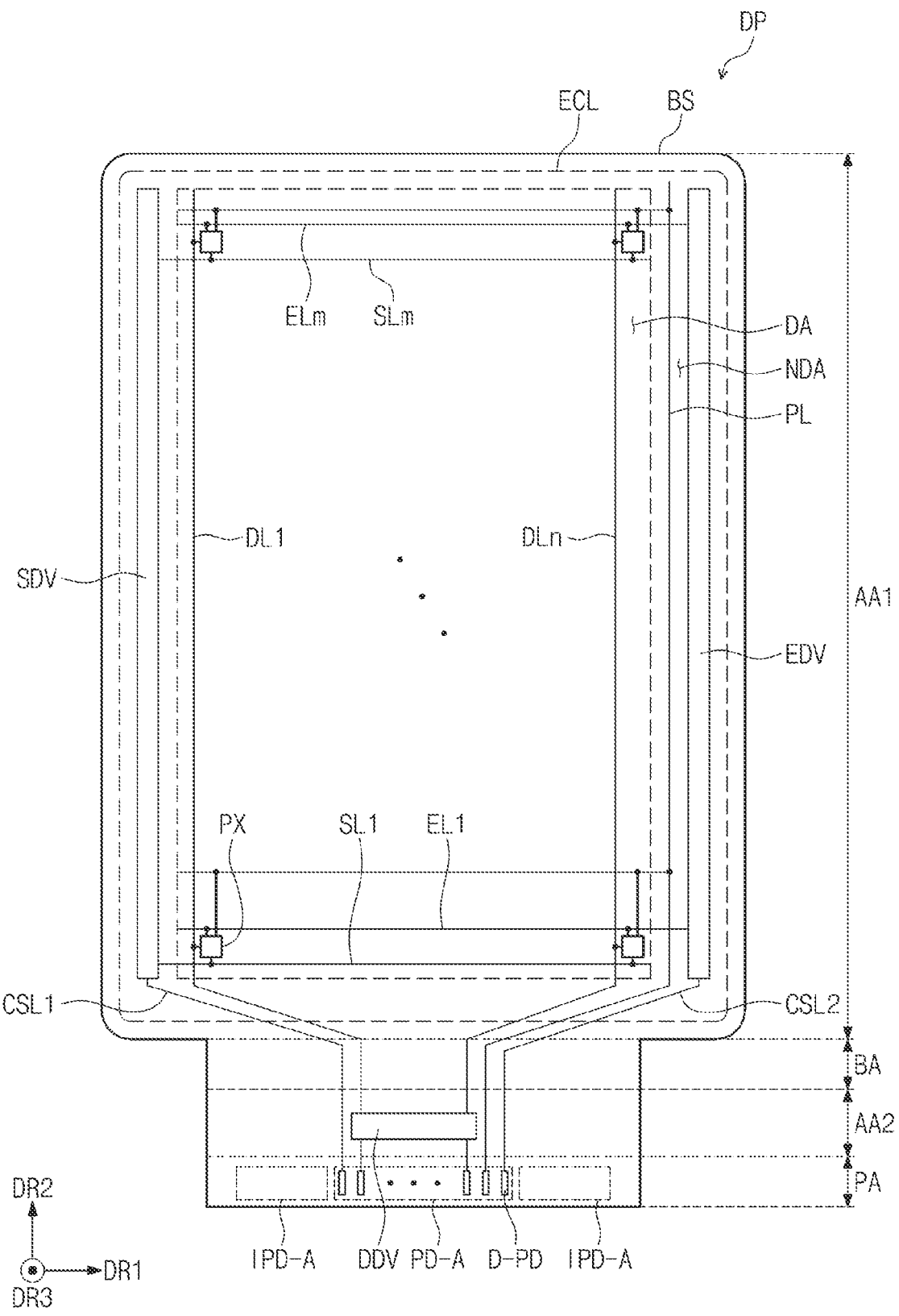
FIG. 4 is a plan view of a display unit according to an embodiment of the inventive concept.

FIG. 4 is a plan view of the display unit DP according to an embodiment of the inventive concept.

Referring to FIG. 4, the display unit DP may include a base substrate BS, pixels PX, signal lines SL1 to SLm, DL1 to DLn, EL1 to ELm, CSL1, CSL2, and PL electrically connected to the pixels PX, a scan driver SDV, a data driver DDV, an emission driver EDV, and display pads D-PD. Each of m and n may be a positive integer.

The base substrate BS may provide a base surface on which electrical elements and lines of the display unit DP are disposed. The base substrate BS may include a first base area AA1, a bending area BA, a second base area AA2, and a pad area PA arranged in the second direction DR2. The bending area BA may extend from the first base area AA1 in the second direction DR2. The second base area AA2 may extend from the bending area BA in the second direction DR2. Accordingly, the first base area AA1 and the second base area AA2 may be spaced apart from each other with the bending area BA disposed therebetween. The pad area PA may extend from the second base area AA2 in the second direction DR2.

The first base area AA1 may include a display area DA. The display area DA may be an area in which the light emitting elements of the pixels PX are disposed. Accordingly, the pixels PX may display an image through the display area DA. The display area DA may correspond to the active area AA (refer to FIG. 2) of the electronic panel EP (refer to FIG. 2), and may overlap the transmissive area TA (refer to FIG. 2).

The remaining first base area AA1 except for the display area DA, the bending area BA, the second base area AA2, and the pad area PA may be defined as a non-display area NDA. The non-display area NDA is adjacent to the display area DA and may be an area in which an image is not displayed. The non-display area NDA may surround the display area DA. In the non-display area NDA, the display pads D-PD electrically connected to the scan driver SDV, the data driver DDV, the emission driver EDV, and the signal lines SL1 to SLm, DL1 to DLn, EL1 to ELm, CSL1, CSL2, and PL that drive the pixels PX may be disposed. Also, the signal lines SL1 to SLm, DL1 to DLn, EL1 to ELm, CSL1, CSL2, and PL electrically connected to the pixels PX may be extended and disposed in the non-display area NDA.

The bending area BA may be an area bent around a bending axis extending in the first direction DR1. That is, the bending area BA may be bent toward the rear surface of the display unit DP corresponding to the first base area AA1. The second base area AA2 and the pad area PA extending from one side of the bending area BA may overlap the first base area AA1 in a plan view as the bending area BA is bent. That is, the second base area AA2 and the pad area PA may be disposed on the rear surface of the display unit DP corresponding to the first base area AA1.

A width of each of the bending area BA, the second base area AA2, and the pad area PA in the first direction DR1 may be smaller than a width of the first base area AA1. That is, since the bending area BA has a smaller width than the first base area AA1 in the direction parallel to the bending axis, the bending area BA may be easily bent. However, this is for illustrative purposes only, and at least one of the widths of the bending area BA, the second base area AA2, and/or the pad area PA in the first direction DR1 may be the same as the width of the first base area AA1, and embodiments of the inventive concept are not limited thereto.

The second base area AA2 may be an area positioned below the first base area AA1 by the bending of the bending area BA and may be provided flatly. The second base area AA2 may be an area through which the signal lines DL1 to DLn, CSL1, CSL2, and PL extending from the bending area BA to the pad area PA pass, and may be an area in which the data driver DDV is disposed.

The pad area PA may be divided into a display pad area PD-A in which the display pads D-PD are disposed and a sensing pad area IPD-A in which sensing pads I-PD (see FIG. 5) to be described below are disposed. FIG. 4 exemplarily illustrates that the display pad area PD-A and the sensing pad area IPD-A are divided in the first direction DR1. For example, the sensing pad area IPD-A may be provided adjacent to both sides of the pad area PA in the first direction DR1, and the display pad area PD-A may be provided in a central portion of the pad area PA. However, embodiments are not necessarily limited thereto, and the arrangement positions of the display pads D-PD and the sensing pads I-PD (refer to FIG. 5) may be variously changed.

The pad area PA may be an area in which the display pads D-PD and the sensing pads I-PD (refer to FIG. 5) are disposed and the circuit board MB (refer to FIG. 2) is connected. As the circuit board MB (refer to FIG. 2) is connected to the pad area PA and the bending area BA is bent, the circuit board MB (refer to FIG. 2) may be positioned on the rear surface of the display unit DP. As the second base area AA2, the pad area PA, and the circuit board MB (refer to FIG. 2) are positioned below the first base area AA1 on the front surface of the electronic apparatus EA, the bezel area of the electronic apparatus EA may be reduced.

Each of the pixels PX includes a pixel driving circuit including transistors (e.g., a switching transistor, a driving transistor, etc.) and at least one capacitor, and a light emitting element connected to the pixel driving circuit. The pixels PX may generate light in response to an electrical signal applied to each of the pixels PX, and display an image through the display area DA. According to an embodiment, some of the pixels PX may include a transistor disposed in the non-display area NDA, but is not limited thereto.

The scan driver SDV and the emission driver EDV may be disposed in the non-display area NDA corresponding to the first base area AA1. The data driver DDV may be disposed in the non-display area NDA corresponding to the second base area AA2. In an embodiment, the data driver DDV may be provided in the form of an integrated circuit chip mounted in the non-display area NDA of the display unit DP. However, embodiments of the inventive concept are not limited thereto, and the data driver DDV may be mounted on a circuit board MB (refer to FIG. 2).

The signal lines SL1 to SLm, DL1 to DLn, EL1 to ELm, CSL1, CSL2, and PL may include scan lines SL1 to SLm, data lines DL1 to DLn, emission lines EL1 to ELm, first and second control lines CSL1 and CSL2, and a power line PL. Here, m and n are positive integers.

The data lines DL1 to DLn may be insulated from and cross the scan lines SL1 to SLm and the emission lines EL1 to ELm. For example, the scan lines SL1 to SLm may extend in the first direction DR1 to be connected to the scan driver SDV. The data lines DL1 to DLn may extend in the second direction DR2 to be connected to the data driver DDV. The emission lines EL1 to ELm may extend in the first direction DR1 to be connected to the emission driver EDV.

The power line PL may include a portion extending in the first direction DR1 and a portion extending in the second direction DR2. The portion extending in the first direction DR1 and the portion extending in the second direction DR2 of the power line PL may be disposed on different layers. The portion of the power line PL extending in the second direction DR2 may be disposed in the non-display area NDA, and may extend from the first base area AA1 to the pad area PA via the bending area BA and the second base area AA2. The power line PL may provide a first voltage to the pixels PX.

The first control line CSL1 may be connected to the scan driver SDV and may extend toward a lower end of the second base area AA2 via the bending area BA. The second control line CSL2 may be connected to the emission driver EDV and may extend toward the lower end of the second base area AA2 via the bending area BA.

The display pads D-PD may be disposed in the pad area PA. Accordingly, the display pads D-PD may be disposed closer to a lower end of the base substrate BS than the data driver DDV disposed in the second base area AA2. The display pads D-PD may be spaced apart from each other in the first direction DR1. The power line PL, the first control line CSL1, and the second control line CSL2 may be respectively connected to a corresponding display pad D-PD among the display pads D-PD. The data lines DL1 to DLn may be electrically connected to a corresponding one of the display pads D-PD through the data driver DDV, respectively. The display pads D-PD may be electrically connected to the circuit board MB (refer to FIG. 2) through an anisotropic conductive adhesive layer, and an electrical signal provided from the circuit board MB (refer to FIG. 2) may be transmitted to the display unit DP through the display pads D-PD. However, the connection method between the display pads D-PD and the circuit board MB (refer to FIG. 2) is not limited thereto.

The scan driver SDV may generate scan signals in response to a scan control signal. The scan signals may be applied to the pixels PX through the scan lines SL1 to SLm. The data driver DDV may generate data voltages corresponding to the image signals in response to a data control signal. The data voltages may be applied to the pixels PX through the data lines DL1 to DLn. The emission driver EDV may generate emission signals in response to an emission control signal. The emission signals may be applied to the pixels PX through the emission lines EL1 to ELm.

The pixels PX may be provided with the data voltages in response to the scan signals. The pixels PX may generate an image by emitting light having a luminance corresponding to the data voltages in response to the emission signals. An emission time of the pixels PX may be controlled by the emission signals.

In FIG. 4, an edge of the encapsulation layer ECL of the display unit DP is illustrated by a dotted line. The edge of the encapsulation layer ECL may be a line extending along the end of an inorganic film of the encapsulation layer ECL, which is described further below. The edge of the encapsulation layer ECL is disposed on the first base area AA1 of the non-display area NDA, and may be formed outside the display area DA.

The bending area BA, the second base area AA2, and the pad area PA may be areas spaced apart from the encapsulation layer ECL of the display unit DP. That is, according to embodiments, the encapsulation layer ECL is not disposed in the bending area BA, the second base area AA2, and the pad area PA. Accordingly, a thickness of the display unit DP corresponding to the bending area BA, the second base area AA2, and the pad area PA may be formed to be relatively thin, and due to this, the bending area BA may be easily bent. In addition, a step difference between one area of the first base area AA1 overlapping the second base area AA2 and the pad area PA and one other area of the first base area AA1 that does not overlap the second base area AA2 and the pad area PA may be minimized or reduced.

Figure 5:
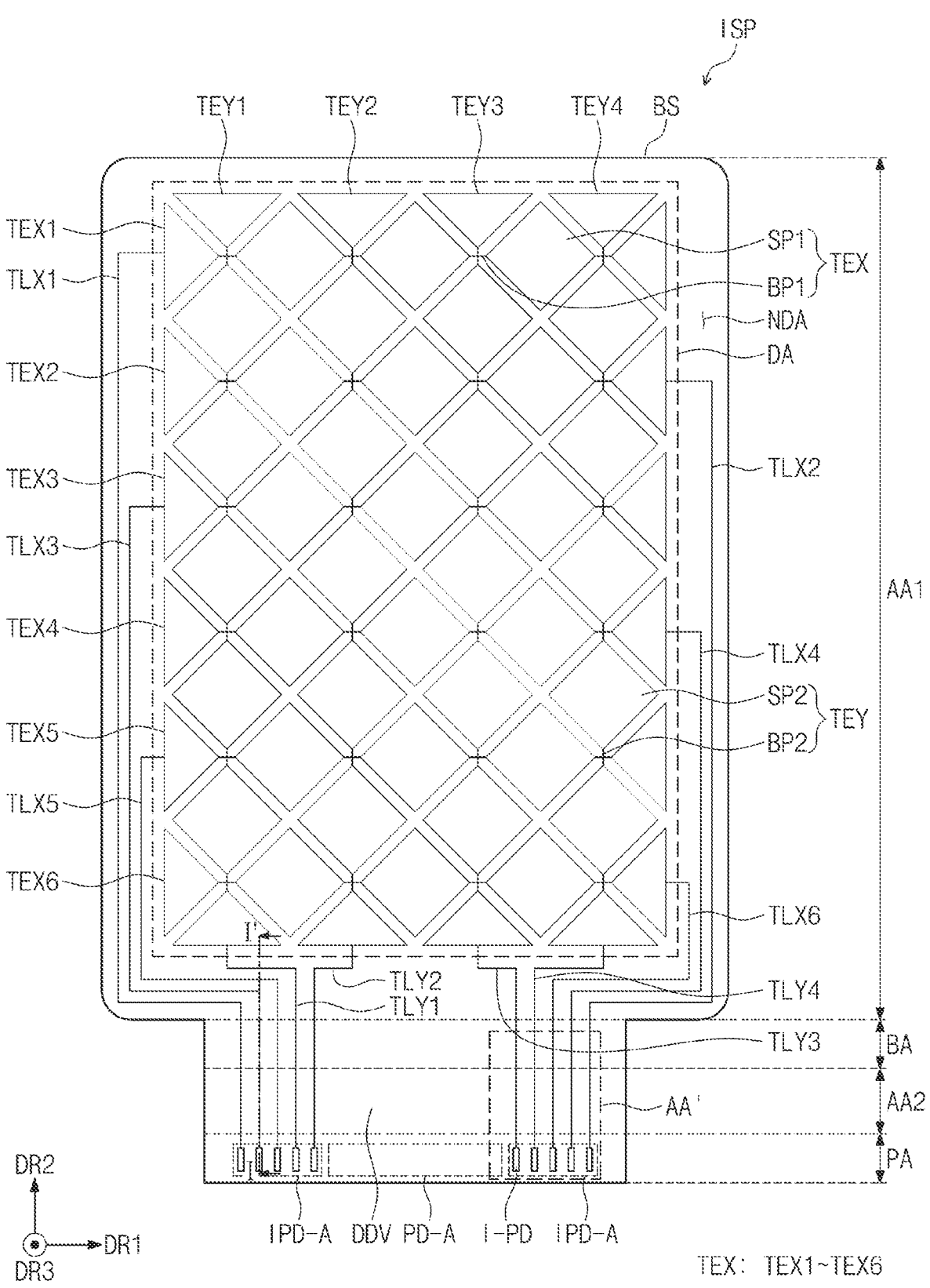
FIG. 5 is a plan view of a sensing unit according to an embodiment of the inventive concept.

FIG. 5 is a plan view of a sensing unit ISP according to an embodiment of the inventive concept. FIG. 5 schematically illustrates the configurations of the detection unit ISP disposed on the base substrate BS for convenience of description.

In an embodiment, the sensing unit ISP may be driven in a mutual-cap type. Referring to FIG. 5, the sensing unit ISP may include first sensing electrodes TEX: TEX1 to TEX6, second sensing electrodes TEY: TEY1 to TEY4, first sensing lines TLX1 to TLX6, second sensing lines TLY1 to TLY4, and sensing pads I-PD. However, embodiments of the inventive concept are not limited thereto. For example, according to embodiments, the sensing unit ISP may be driven by a self-cap type.

Each of the first sensing electrodes TEX may extend along the first direction DR1, and the first sensing electrodes TEX may be arranged along the second direction DR2. FIG. 5 exemplarily illustrates six first sensing electrodes TEX1 to TEX6. However, the number of first sensing electrodes TEX included in the sensing unit ISP is not limited thereto. One first sensing electrode TEX may include first sensing patterns SP1 arranged in the first direction DR1 and first connection patterns BP1 connecting the first sensing patterns SP1.

Each of the second sensing electrodes TEY may extend along the second direction DR2, and the second sensing electrodes TEY may be arranged along the first direction DR1. FIG. 5 exemplarily illustrates four second sensing electrodes TEY1 to TEY4. However, the number of second sensing electrodes TEY included in the sensing unit ISP is not limited thereto. One second sensing electrode TEY may include second sensing patterns SP2 arranged along the second direction DR2 and second connection patterns BP2 connecting the second sensing patterns SP2.

The first sensing electrodes TEX and the second sensing electrodes TEY may be electrically insulated. The sensing unit ISP may sense an external input through a change in capacitance between the first sensing electrodes TEX and the second sensing electrodes TEY. The first sensing electrodes TEX and the second sensing electrodes TEY may be disposed in an area corresponding to the display area DA of the base substrate BS. Accordingly, the electronic apparatus EA (refer to FIG. 1) may display an image through the display area DA and simultaneously sense an external input applied to the display area DA.

The first sensing lines TLX1 to TLX6 may be disposed in the non-display area NDA and electrically connected to the first sensing electrodes TEX1 to TEX6, respectively. For example, each of the first sensing lines TLX1 to TLX6 may be connected to one of the first sensing electrodes TEX1 to TEX6. Some of the first sensing lines TLX1 to TLX6 may be disposed on a left side of the non-display area NDA, and the remaining parts of the first sensing lines TLX1 to TLX6 may be disposed on a right side of the non-display area NDA. For example, the first sensing lines TLX1, TLX3, and TLX5 connected to the first sensing electrodes TEX1, TEX3, and TEX5 arranged in odd rows may be respectively connected to the left sides of the first sensing electrodes TEX1, TEX3, and TEX5, and the first sensing lines TLX2, TLX4, and TLX6 connected to the first sensing electrodes TEX2, TEX4, and TEX6 arranged in even rows may be respectively connected to right sides of the first sensing electrodes TEX2, TEX4, and TEX6. However, the arrangement of the first sensing lines TLX1 to TLX6 is not limited thereto. For example, according to embodiments, all of the first sensing lines TLX1 to TLX6 may be disposed on the left side of the non-display area NDA, or all of the first sensing lines TLX1 to TLX6 may be disposed on the right side of the non-display area NDA.

Each of the first sensing lines TLX1 to TLX6 may extend from the first base area AA1 toward the second base area AA2 via the bending area BA. The first sensing lines TLX1 to TLX6 may be respectively connected to the sensing pads I-PD disposed in the sensing pad area IPD-A of the pad area PA.

The second sensing lines TLY1 to TLY4 may be disposed in the non-display area NDA and electrically connected to the second sensing electrodes TEY1 to TEY4, respectively. For example, each of the second sensing lines TLY1 to TLY4 may be connected to one of the second sensing electrodes TEY1 to TEY4. Some of the second sensing lines TLY1 to TLY4 may be disposed adjacent to the left side of the non-display area NDA, and the remaining parts of the second sensing lines TLY1 to TLY4 may be disposed adjacent to the right side of the non-display area NDA. For example, the second sensing lines TLY1 and TLY2 connected to the second sensing electrodes TEY1 and TEY2 disposed on the left side from the center among the second sensing electrodes TEY1 to TEY4 may be disposed adjacent to the left side of the first base area AA1, and the second sensing lines TLY3 and TLY4 connected to the second sensing electrodes TEY3 and TEY4 disposed on the right side from the center may be disposed adjacent to the right side of the first base area AA1. However, the arrangement of the second sensing lines TLY1 to TLY4 is not limited thereto.

Each of the second sensing lines TLY1 to TLY4 may extend from an area adjacent to a lower end of the first base area AA1 toward the second base area AA2 via the bending area BA. The second sensing lines TLY1 to TLY4 may be respectively connected to the sensing pads I-PD disposed in the sensing pad area IPD-A of the pad area PA.

Some of the sensing pads I-PD may be disposed in an area adjacent to the left side of the pad area PA in the first direction DR1, and the remaining parts of the sensing pads I-PD may be disposed in an area adjacent to the right side of the pad area PA in the first direction DR1. For example, the sensing pads I-PD may be divided into two groups spaced apart from each other with the display pad area PD-A disposed therebetween. However, the arrangement of the sensing pads I-PD is not limited thereto.

The sensing pads I-PD may be disposed on the same layer as the display pads D-PD (refer to FIG. 4). The sensing pads I-PD may be disposed on a layer different from that of the first and second sensing lines TLX1 to TLX6 and TLY1 to TLY4 to be connected through a contact hole. However, embodiments of the inventive concept are not limited thereto. For example, according to embodiments, the sensing pads I-PD may be disposed on a different layer from the display pads D-PD (refer to FIG. 4). For example, the sensing pads I-PD may be integrally formed on the same layer as the first and second sensing lines TLX1 to TLX6 and TLY1 to TLY4.

The first and second sensing lines TLX1 to TLX6 and TLY1 to TLY4 may be disposed above the components of the display unit DP (refer to FIG. 4) in an area corresponding to the non-display area NDA of the base substrate BS. Accordingly, the first and second sensing lines TLX1 to TLX6 and TLY1 to TLY4 may overlap the components of the display unit DP (refer to FIG. 4) in the bending area BA and the second base area AA2. However, as the encapsulation layer ECL (see FIG. 4) is not disposed in the bending area BA and the second base area AA2, the first and second sensing lines TLX1 to TLX6 and TLY1 to TLY4 and the components of the display unit DP (see FIG. 4) overlapping each other in the bending area BA and the second base area AA2 may affect each other electrically. For example, the first and second sensing lines TLX1 to TLX6 and TLY1 to TLY4 may overlap at least some of the signal lines SL1 to SLm, DL1 to DLn, EL1 to ELm, CSL1, CSL2, and PL (see FIG. 4) of the display unit DP (see FIG. 4) in a plan view, and electrical signals transmitted to the signal lines SL1 to SLm, DL1 to DLn, EL1 to ELm, CSL1, CSL2, and PL (see FIG. 4) of the display unit DP (see FIG. 4) may affect the first and second sensing lines TLX1 to TLX6, and TLY1 to TLY4 such that parasitic capacitance or noise may be generated.

As the electronic apparatus EA (see FIG. 1) according to an embodiment of the inventive concept includes a shield electrode BE (see FIG. 6) that extends from the first base area AA1 toward the bending area BA and the second base area AA2, the sensing lines (e.g., the first and second sensing lines TLX1 to TLX6 and TLY1 to TLY4) of the sensing unit ISP may overlap the shield electrode BE (see FIG. 6) in a plan view, and may prevent parasitic capacitance or noise from being generated in the sensing lines by the signal lines of the display unit DP. In addition, as the shield electrode BE (see FIG. 6) is formed to have a predetermined area in the bending area BA and the second base area AA2, the sensing lines may have a sufficient width without being affected by the signal lines of the display unit DP. Hereinafter, the shield electrode BE (see FIG. 6) will be described in further detail below.

Figure 6:
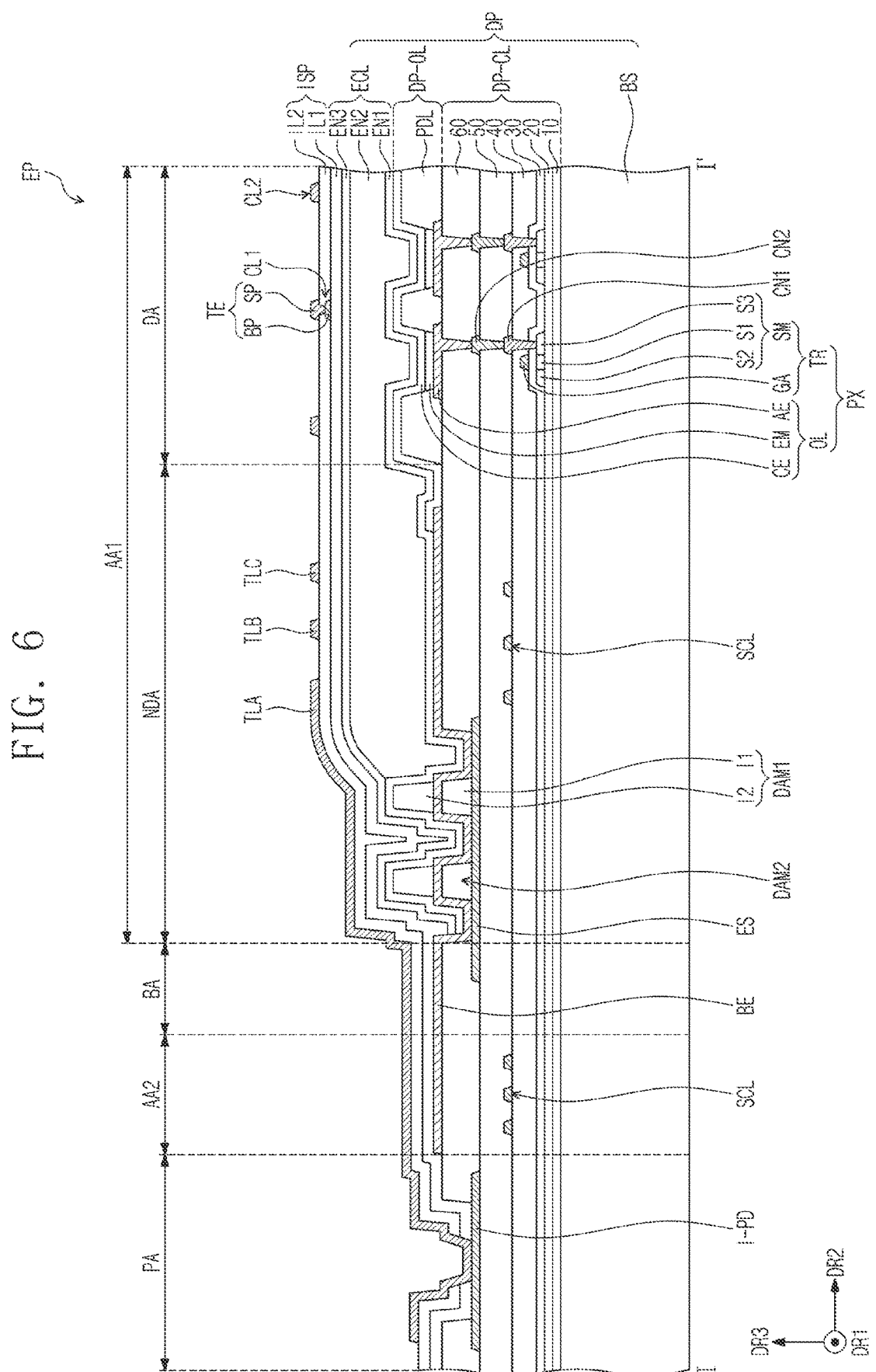
FIG. 6 is a cross-sectional view of an electronic panel according to an embodiment of the inventive concept.

FIG. 6 is a cross-sectional view of an electronic panel EP according to an embodiment of the inventive concept. FIG. 6 exemplarily illustrates a cross-section of the electronic panel EP corresponding to line I-I' of FIG. 5. As shown in FIG. 6, the electronic panel EP may include a display unit DP and a sensing unit ISP disposed on the display unit DP, and with respect to each configuration, the above description may be equally applied.

Referring to FIG. 6, the display unit DP may include a base substrate BS, a circuit layer DP-CL, a display element layer DP-OL, and an encapsulation layer ECL.

The base substrate BS may be insulated and may provide a base surface on which components of the electronic panel EP are disposed. The base substrate BS may be flexible and bendable. As described above, the base substrate BS may include a first base area AA1, a bending area BA, a second base area AA2, and a pad area PA, and the bending area BA of the base substrate BS may be bent with a predetermined curvature.

The circuit layer DP-CL may include insulating layers 10 to 60 disposed on the base substrate BS, a transistor TR of the pixel PX, connection electrodes CN1 and CN2, and signal lines SCL. The insulating layers 10 to 60 may include first to sixth insulating layers 10 to 60 sequentially stacked on the base substrate BS. However, embodiments of the insulating layers 10 to 60 included in the circuit layer DP-CL are not limited thereto, and may be changed according to the configuration or manufacturing process of the circuit layer DP-CL.

The first insulating layer 10 may be disposed on the base substrate BS. The first insulating layer 10 may serve as a barrier layer that prevents foreign substances from being introduced from outside of the electronic apparatus EA. The first insulating layer 10 may include at least one of a silicon oxide layer and/or a silicon nitride layer. In an embodiment, the first insulating layer 10 may include alternately stacked silicon oxide layers and silicon nitride layers.

The second insulating layer 20 may be disposed on the first insulating layer 10. The second insulating layer 20 may serve as a buffer layer that increases a bonding force between the base substrate BS and the semiconductor pattern and/or the conductive pattern of the circuit layer DP-CL. The second insulating layer 20 may include at least one of a silicon oxide layer and/or a silicon nitride layer. In an embodiment, the second insulating layer 20 may include alternately stacked silicon oxide layers and silicon nitride layers.

The pixel PX may be disposed on the base substrate BS. FIG. 6 exemplarily illustrates a partial configuration of the pixel PX. The pixel PX may include the transistor TR and a light emitting element OL.

The transistor TR may include a semiconductor pattern SM and a gate GA. The semiconductor pattern SM may be disposed on the second insulating layer 20. The semiconductor pattern SM may include a channel 51, a source S2, and a drain S3. The semiconductor pattern SM may include a silicon semiconductor, and may include, for example, a single crystal silicon semiconductor, a polysilicon semiconductor, or an amorphous silicon semiconductor. However, embodiments of the inventive concept are not limited thereto. For example, according to embodiments, the semiconductor pattern SM may include an oxide semiconductor. The semiconductor pattern SM according to an embodiment of the inventive concept may be formed of various materials having semiconductor properties.

The semiconductor pattern SM may include a plurality of regions having different electrical properties depending on whether the semiconductor pattern is doped or reduced. For example, the semiconductor pattern SM may include a region with high conductivity due to doping or reduction of metal oxide, and the region with high conductivity may serve as an electrode or a signal line. This may correspond to the source S2 and the drain S3 of the transistor TR. The semiconductor pattern SM may include an undoped region having relatively low conductivity, which may correspond to the channel 51 (or active) of the transistor TR.

The third insulating layer 30 may be disposed on the second insulating layer 20 such that the third insulating layer 30 covers the semiconductor pattern SM. The gate GA may be disposed on the third insulating layer 30. That is, the third insulating layer 30 may be disposed between the semiconductor pattern SM of the transistor TR and the gate GA. The gate GA may overlap the channel 51 of the semiconductor pattern SM in a plan view. The gate GA may function as a mask in the process of doping the semiconductor pattern SM.

The third insulating layer 30 and the fourth to sixth insulating layers 40 to 60, which are described further below, may include at least one of an inorganic layer and/or an organic layer. For example, the inorganic layer may include at least one of aluminum oxide, titanium oxide, silicon oxide, silicon oxynitride, zirconium oxide, and/or hafnium oxide. The organic layer may include at least one of acrylic resins, methacrylic resins, polyisoprene, vinyl resins, epoxy resins, urethane resins, cellulose resins, siloxane resins, polyamide resins, and/or perylene resins.

The structure of the transistor TR shown in FIG. 6 is an example, and the source S2 or the drain S3 of the transistor TR may be electrodes independently formed from the semiconductor pattern SM. In this case, the source S2 and the drain S3 may contact the semiconductor pattern SM or pass through the insulating layer to be connected to the semiconductor pattern SM. Also, the gate GA may be disposed under the semiconductor pattern SM. The transistor TR according to an embodiment of the inventive concept may be formed in various structures.

The fourth insulating layer 40 is disposed on the third insulating layer 30 and may cover the gate GA. The fifth insulating layer 50 may be disposed on the fourth insulating layer 40. In an embodiment, the fourth insulating layer 40 may include an inorganic layer, and the fifth insulating layer 50 may include an organic layer and provide a flat top surface. However, embodiments of the inventive concept are not necessarily limited thereto.

The connection electrodes CN1 and CN2 may include a first connection electrode CN1 and a second connection electrode CN2. The first connection electrode CN1 may be disposed on the fourth insulating layer 40. The first connection electrode CN1 may be electrically connected to the semiconductor pattern SM through a contact hole penetrating the third insulating layer 30 and the fourth insulating layer 40. The second connection electrode CN2 may be disposed on the fifth insulating layer 50. The second connection electrode CN2 may be electrically connected to the first connection electrode CN1 through a contact hole passing through the fifth insulating layer 50.

According to an embodiment of the circuit layer DP-CL, at least one of the first connection electrode CN1 and/or the second connection electrode CN2 may be omitted. Alternatively, an additional connection electrode connecting the transistor TR and the light emitting element OL may be further disposed. Depending on the number of insulating layers disposed between the light emitting element OL and the transistor TR, an electrical connection method between the light emitting element OL and the transistor TR may be variously changed.

The sixth insulating layer 60 may be disposed on the fifth insulating layer 50 and may cover the second connection electrode CN2. In an embodiment, the sixth insulating layer 60 includes an organic layer, and may cover a step difference between components disposed under the sixth insulating layer 60. However, embodiments of the inventive concept are not necessarily limited thereto.

The display element layer DP-OL may include the light emitting element OL and a pixel defining film PDL. The light emitting element OL and a pixel defining film PDL may be disposed on the sixth insulating layer 60. The light emitting element OL may include a first electrode AE, a light emitting layer EM, and a second electrode CE.

The first electrode AE may be electrically connected to the second connection electrode CN2 through a contact hole penetrating the sixth insulating layer 60. The first electrode AE may be electrically connected to the transistor TR through the first and second connection electrodes CN1 and CN2.

In the pixel defining film PDL, a pixel opening exposing at least a portion of the first electrode AE may be defined. One area of the first electrode AE exposed from the pixel defining film PDL may correspond to the emission area. The pixel defining film PDL may be, for example, an inorganic layer, an organic layer, or a combination thereof. According to an embodiment, the pixel defining film PDL may further include a black pigment or a black dye.

The light emitting layer EM may be disposed on the first electrode AE. The light emitting layer EM may provide light having a color. The light emitting layer EM may correspond to the pixel opening defined in the pixel defining film PDL. That is, a plurality of light emitting elements OL may be provided, and light emitting layers EM of the light emitting elements OL may be provided in a pattern spaced apart from each other. However, embodiments of the inventive concept are not limited thereto. For example, according to embodiments, the light emitting layers EM of the light emitting elements OL may be formed as an integral common layer.

The second electrode CE may be disposed on the light emitting layer EM and the pixel defining film PDL. The second electrode CE may be provided as a common electrode commonly disposed to the pixels PX. The second electrode CE may extend from the display area DA toward the non-display area NDA and may cover an end of the pixel defining film PDL.

Each of the first electrode AE and the second electrode CE may be a transmissive electrode, a transflective electrode, or a reflective electrode. The transmissive electrode may include a transparent metal oxide, for example, indium tin oxide (ITO), indium zinc oxide (IZO), zinc oxide (ZnO), or indium tin zinc oxide (ITZO). The transflective electrode or the reflective electrode may include, for example, Ag, Mg, Cu, Al, Pt, Pd, Au, Ni, Nd, Ir, Cr, Li, Ca, Mo, Ti, Yb, W, a compound or mixture including them (e.g., AgMg, AgYb, or MgYb), or a laminated structure including them (e.g., LiF/Ca (laminated structure of LiF and Ca), LiF/Al (laminated structure of LiF and Al)).

Each of the first electrode AE and the second electrode CE may have a multilayer structure including a reflective or semi-transmissive film formed of the above material and a transparent conductive film formed of, for example, indium tin oxide (ITO), indium zinc oxide (IZO), zinc oxide (ZnO), indium tin zinc oxide (ITZO), or the like. For example, the electrode having the multilayer structure may have a three-layer structure of ITO/Ag/ITO, but is not limited thereto.

The light emitting element OL may further include at least one of a hole control region disposed between the first electrode AE and the light emitting layer EM, and/or an electronic control region disposed between the light emitting layer EM and the second electrode CE. The hole control region may include at least one of a hole generating layer, a hole transport layer, and/or an electron blocking layer, and the electron control region may include at least one of an electron generating layer, an electron transport layer, and/or a hole blocking layer.

The encapsulation layer ECL may be disposed on the display element layer DP-OL. The encapsulation layer ECL may be disposed on the light emitting element OL and the pixel defining film PDL, and may encapsulate the light emitting element OL. The encapsulation layer ECL may include at least one of an inorganic film and/or an organic film. In an embodiment, the encapsulation layer ECL may include a first inorganic film EN1, a second inorganic film EN3, and an organic film EN2 disposed between the first and second inorganic films EN1 and EN3. However, the configuration of the encapsulation layer ECL is not limited thereto, as long as the configuration seals the light emitting element OL.

The first inorganic film EN1 may be disposed on the second electrode CE, and the organic film EN2 and the second inorganic film EN3 may be sequentially disposed on the first inorganic film EN1 in the third direction DR3. The first and second inorganic films EN1 and EN3 may protect the light emitting element OL from moisture or oxygen introduced from outside of the electronic apparatus EA. For example, each of the first and second inorganic films EN1 and EN3 may include at least one of silicon nitride, silicon oxynitride, silicon oxide, titanium oxide, and/or aluminum oxide. However, the materials of the first and second inorganic films EN1 and EN3 are not limited to the above example. The organic film EN2 may prevent foreign substances from entering the light emitting element OL, and may cover the step difference of components disposed under the organic film EN2. For example, the organic film EN2 may include an acryl-based organic material. However, the material of the organic film EN2 is not limited to the above example.

The signal lines SCL of the display unit DP may be disposed in the non-display area NDA of the first base area AA1 and the second base area AA2. Although not shown in the cross section of FIG. 6, the signal lines SCL may extend from the first base area AA1 and may be disposed on the second base area AA2 via the bending area BA. In FIG. 6, the signal lines SCL are illustrated as being disposed on the fourth insulating layer 40, but the arrangement position of the signal lines SCL is not limited thereto, as long as the signal lines SCL are arranged between the first to sixth insulating layers 10 to 60. The signal lines SCL of FIG. 6 may be electrically connected to the pixel PX of the display unit DP, and may correspond to at least some of the above-described signal lines SL1 to SLm, DL1 to DLn, EL1 to ELm, CSL1, CSL2, and PL of FIG. 4.

The electronic panel EP may include a power pattern ES. The power pattern ES may be disposed in the non-display area NDA. The power pattern ES may be electrically connected to the second electrode CE to provide a first voltage to the second electrode CE. That is, the power pattern ES may provide the first voltage to the pixel PX through the second electrode CE.

The electronic panel EP may further include dams DAM1 and DAM2 disposed in the non-display area NDA of the base substrate BS. The dams DAM1 and DAM2 may include a first dam DAM1 and a second dam DAM2 spaced apart from the first dam DAM1. Among the dams DAM1 and DAM2, the first dam DAM1 may be disposed closer to the display area DA than the second dam DAM2 in the second direction DR2.

The dams DAM1 and DAM2 may define an arrangement area of the encapsulation layer ECL. That is, the dams DAM1 and DAM2 may prevent the encapsulation layer ECL from being disposed in the bending area BA. For example, the organic film EN2 of the encapsulation layer ECL may be formed of an organic resin having fluidity, and the dams DAM1 and DAM2 may prevent the organic resin from overflowing toward the bending area BA.

Each of the dams DAM1 and DAM2 may include a plurality of layers I1 and I2. FIG. 6 exemplarily shows that the first dam DAM1 and the second dam DAM2 have the same two-layer structure, but embodiments are not limited thereto. For example, according to embodiments, the first dam DAM1 and the second dam DAM2 may have different multi-layer structures. For example, the first dam DAM1 may have a two-layer structure, and the second dam DAM2 may have a three-layer structure. The dams DAM1 and DAM2 may have various structures as long as the structure allows for the overflow of the encapsulation layer ECL to be prevented. Hereinafter, the structure of the dam will be described with reference to the first dam DAM1.

The first dam DAM1 may include a first layer I1 and a second layer I2 disposed on the first layer I1. Each of the first layer I1 and the second layer I2 may be simultaneously formed during the formation of the insulating layers 10 to 60 of the circuit layer DP-CL or the pixel defining film PDL. For example, the first layer I1 of the first dam DAM1 may be disposed on the same layer as the sixth insulating layer 60 and formed simultaneously during the formation of the sixth insulating layer 60, and the second layer I2 may be disposed on the same layer as the pixel defining film PDL and formed simultaneously in the process of forming the pixel defining film PDL. However, this is an example, and the configuration of the first dam DAM1 is not limited thereto.

As the flow of the organic film EN2 of the encapsulation layer ECL is controlled by the first dam DAM1, the second dam DAM2 may be separated from the organic film EN2. The first and second inorganic films EN1 and EN3 of the encapsulation layer ECL may cover the first and second dams DAM1 and DAM2. The first and second inorganic films EN1 and EN3 may contact each other in the area where the dams DAM1 and DAM2 are disposed, and the first and second inorganic films EN1 and EN3 in contact with each other may block the inflow of moisture or oxygen into the organic film EN2.

The sensing unit ISP may be disposed on the display unit DP. The sensing unit ISP may include a base layer IL1, a first sensing insulating layer IL2, a first conductive layer CL1, and a second conductive layer CL2. The sensing unit ISP may further include a second sensing insulating layer IL3 (refer to FIG. 3) as shown in FIG. 3. The above description with respect to each configuration may be equally applied.

The base layer IL1 may contact an uppermost layer of the encapsulation layer ECL. For example, the base layer IL1 may contact the second inorganic film EN3 of the encapsulation layer ECL. The base layer IL1 of the sensing unit ISP may be directly formed on the base surface provided by the encapsulation layer ECL. However, embodiments of the inventive concept are not limited thereto. For example, according to embodiments, the base layer IL1 may be omitted, and in this case, the first conductive layer CL1 of the sensing unit ISP may contact the encapsulation layer ECL.

The first conductive layer CL1 may be disposed on the base layer IL1, and the second conductive layer CL2 may be disposed on the first sensing insulating layer IL2. The first conductive layer CL1 and the second conductive layer CL2 may constitute a sensing electrode TE. The sensing electrode TE may correspond to the above-described first and second sensing electrodes TEX and TEY (refer to FIG. 5). For example, the first conductive layer CL1 may include a connection pattern BP of the sensing electrode TE, and the second conductive layer CL2 may include a sensing pattern SP of the sensing electrode TE. However, embodiments of the inventive concept are not limited thereto. For example, according to embodiments, the first conductive layer CL1 may include the sensing pattern SP and the second conductive layer CL2 may include the connection pattern BP.

The connection pattern BP may correspond to the first connection pattern BP1 or the second connection pattern BP2 described above, and the sensing pattern SP may correspond to the first sensing pattern SP1 or the second sensing pattern SP2 described above. The connection pattern BP may be disposed on a layer different from the sensing pattern SP and may be connected through a contact hole penetrating the first detection insulating layer IL2. However, embodiments of the inventive concept are not limited thereto. For example, according to embodiments, the connection pattern BP and the sensing pattern SP may be disposed on the same layer to be integrally formed.

The sensing electrode TE may be a mesh-shaped pattern, and may correspond to an area in which the pixel defining film PDL is disposed. However, embodiments of the inventive concept are not limited thereto. For example, according to embodiments, the sensing electrode TE may be provided in a single shape pattern overlapping the light emitting element OL, and in this case, the sensing electrode TE may include a transparent conductive material.

The base layer IL1 and the first sensing insulating layer IL2 may be disposed on the encapsulation layer ECL in the first base area AA1. Each of the base layer IL1 and the first sensing insulating layer IL2 may extend from the first base area AA1 to the bending area BA and the second base area AA2 where the encapsulation layer ECL is not disposed, and may be disposed in the bending area BA and the second base area AA2. The shield electrode BE may be covered by the base layer IL1 and the first sensing insulating layer IL2. However, embodiments of the inventive concept are not limited thereto. For example, according to embodiments, only one of the base layer IL1 and the first sensing insulating layer IL2 may be disposed in the bending area BA and the second base area AA2.

The second conductive layer CL2 may include sensing lines TLA, TLB, and TLC. The sensing lines TLA, TLB, and TLC may correspond to at least some of the above-described first and second sensing lines TLX1 to TLX6 and TLY1 to TLY4 (refer to FIG. 5). The sensing lines TLA, TLB, and TLC may be disposed on the first sensing insulating layer IL2. However, embodiments of the inventive concept are not limited thereto. For example, according to embodiments, the first conductive layer CL1 may include sensing lines TLA, TLB, and TLC. Each of the sensing lines TLA, TLB, and TLC may extend from the first base area AA1 toward the second base area AA2 like the first and second sensing lines TLX1 to TLX6 and TLY1 to TLY4 shown in FIG. 5.

The sensing pad I-PD may be disposed in the pad area PA. The sensing pad I-PD may be disposed on the same layer as the power pattern ES. For example, the sensing pad I-PD may be disposed on the fifth insulating layer 50. However, the arrangement position of the sensing pad I-PD on the cross section is not limited thereto.

Each of the sensing lines TLA, TLB, and TLC may be electrically connected to a corresponding sensing pad I-PD. FIG. 6 exemplarily illustrates a cross-section of one sensing line TLA electrically connected to the sensing pad I-PD among sensing lines TLA, TLB, and TLC.

At least a portion of an upper surface of the sensing pad I-PD may be exposed from the sixth insulating layer 60, the base layer IL1, and the first sensing insulating layer IL2 disposed in the pad area PA, and the sensing line TLA may be disposed on the exposed upper surface of the sensing pad I-PD. That is, the sensing line TLA may extend from the non-display area NDA of the first base area AA1 to the area where the sensing pad I-PD is disposed, through the bending area BA and the second base area AA2. The sensing pad I-PD and the sensing line TLA may be in contact with and electrically connected to each other.

The encapsulation layer ECL may extend from the display area DA to the non-display area NDA in the first base area AA1. According to embodiments, the encapsulation layer ECL does not overlap the bending area BA, the second base area AA2, and the pad area PA. That is, the end of the encapsulation layer ECL may be disposed on the first base area AA1. For example, ends of each of the first inorganic film EN1, the organic film EN2, and the second inorganic film EN3 of the encapsulation layer ECL may be disposed on the first base area AA1.

By not placing the encapsulation layer ECL, the thickness of the display unit DP corresponding to the bending area BA, the second base area AA2, and the pad area PA may be formed to be relatively thin, and due to this, the bending area BA may be easily bent. In addition, since the second base area AA2 and the pad area PA positioned on the rear surface of the first base area AA1 due to bending of the bending area BA have a relatively thin thicknesses, a step difference between one area of the first base area AA1 overlapping the second base area AA2 and the pad area PA, and another area of the first base area AA1 that does not overlap the second base area AA2 and the pad area PA, may be minimized or reduced.

However, as the encapsulation layer ECL is not disposed in the bending area BA and the second base area AA2, the signal lines SCL and the sensing lines TLA, TLB, and TLC disposed in the bending area BA and the second base area AA2 may be disposed closer to each other in the third direction DR3. For this reason, electrical signals transmitted to each of the signal lines SCL and the sensing lines TLA, TLB, and TLC may be easily influenced by each other, and parasitic capacitance or noise may be generated.

The electronic panel EP may include the shield electrode BE disposed on the power pattern ES. The shield electrode BE may be disposed in the first base area AA1, and may extend from the first base area AA1 to the second base area AA2 via the bending area BA. According to an embodiment, the shield electrode BE may be disposed between the layers I1 and I2 of the dams DAM1 and DAM2 on the cross-section. However, embodiments of the inventive concept are not necessarily limited thereto.

The shield electrode BE may be disposed between the signal lines SCL of the display unit DP and the detection lines TLA, TLB, and TLC of the sensing unit ISP in the third direction DR3. That is, the shield electrode BE may overlap each of the signal lines SCL and the sensing lines TLA, TLB, and TLC in a plan view. The shield electrode BE may block the occurrence of parasitic capacitance between the signal lines SCL and the sensing lines TLA, TLB, and TLC, and/or may prevent noise from being generated, or reduce the amount of noise generated, in the sensing lines TLA, TLB, and TLC by an electrical signal transmitted to the signal lines SCL. For example, as the encapsulation layer ECL is not disposed in the bending area BA and the second base area AA2, the shield electrode BE shields the signal lines SCL and the sensing lines TLA, TLB, and TLC, which are vulnerable to electrical influences, from each other, which may increase the reliability of the electronic panel EP.

The shield electrode BE may be connected to the power pattern ES and may receive the same voltage as the voltage applied to the power pattern ES. One end of the shield electrode BE may be connected to the second electrode CE in the first base area AA1, and a portion of the shield electrode BE may be connected to the power pattern ES. Accordingly, the first voltage applied to the power pattern ES may be transmitted to the second electrode CE through the shield electrode BE.

The shield electrode BE may be disposed on the same layer as the first electrode AE. For example, the shield electrode BE may be disposed on the sixth insulating layer 60 in the first base area AA1. The shield electrode BE may be formed simultaneously with the first electrode AE during the formation of the first electrode AE. Accordingly, the shield electrode BE may include the same material as the first electrode AE.

However, embodiments of the inventive concept are not limited thereto. For example, according to embodiments, the shield electrode BE may be integrally formed with the second electrode CE. In this case, the second electrode CE disposed on the pixel defining film PDL may cover the end of the pixel defining film PDL in the first base area AA1, and the second electrode CE may extend from the first base area AA1 to the second base area AA2 via the bending area BA. In an embodiment, a portion of the second electrode CE disposed in the bending area BA and the second base area AA2 may correspond to the shield electrode BE. Accordingly, the shield electrode BE may be disposed on the same layer as the second electrode CE and may include the same material as the second electrode CE.

As the shield electrode BE is formed on the same layer as the first electrode AE or the second electrode CE of the display element layer DP-OL, instead of between the insulating layers 10 to 60 in the circuit layer DP-CL, it may be formed to have a large planar area in the bending area BA and the second base area AA2. Accordingly, the shield electrode BE may overlap all of the sensing lines TLA, TLB, and TLC in the bending area BA and the second base area AA2.

If the power pattern ES is used as a shield electrode, the power pattern ES disposed in the circuit layer DP-CL may have a limit in the disposable area due to other configurations of the circuit layer DP-CL disposed on the same layer, and the sensing lines TLA, TLB, and TLC may be protected only within a limited area. This will be described in more detail with reference to FIGS. 7A and 7B.

Figure 7A:
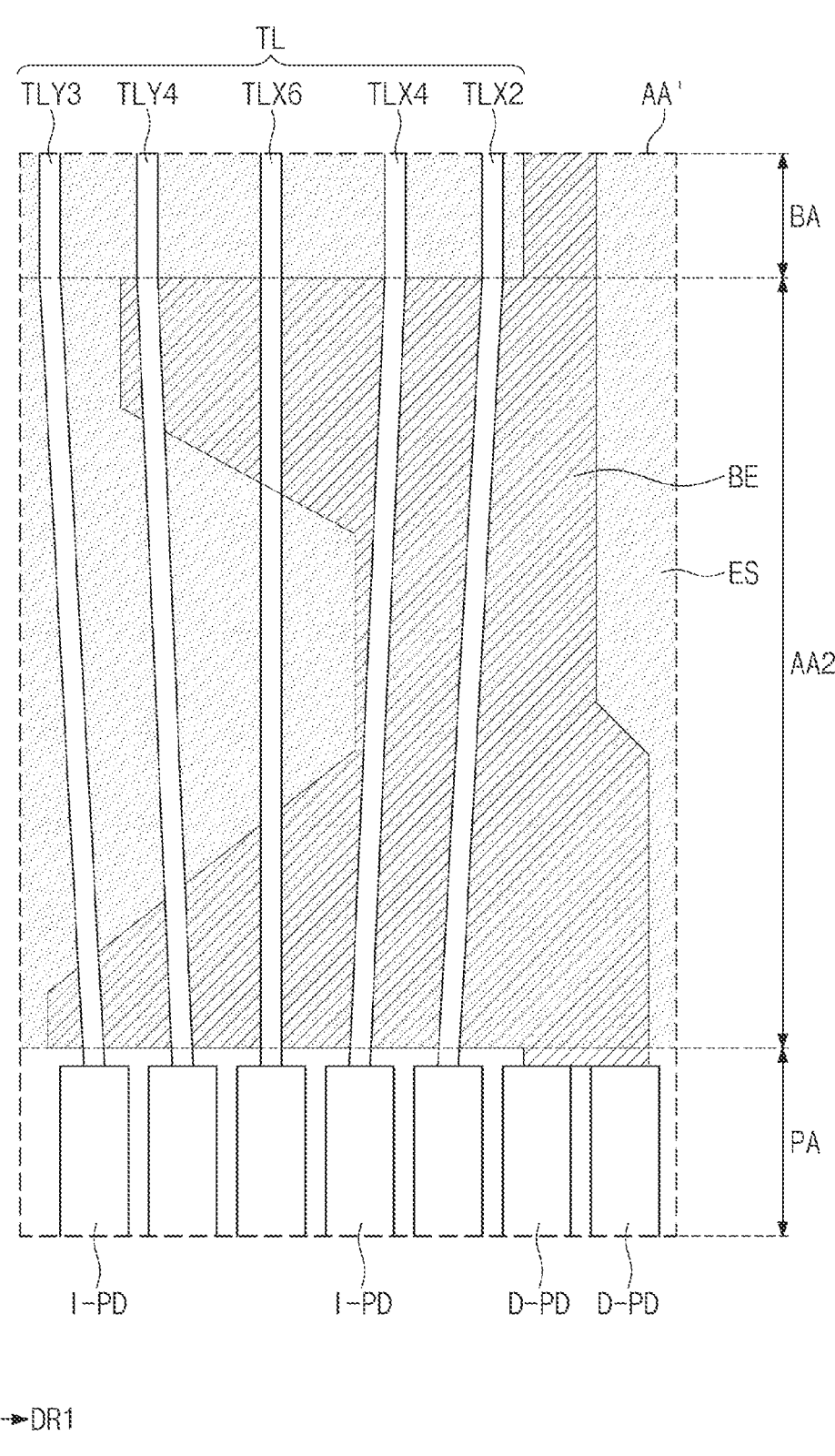
FIG. 7A is an enlarged plan view of an electronic panel according to an embodiment of the inventive concept.
Figure 7B:
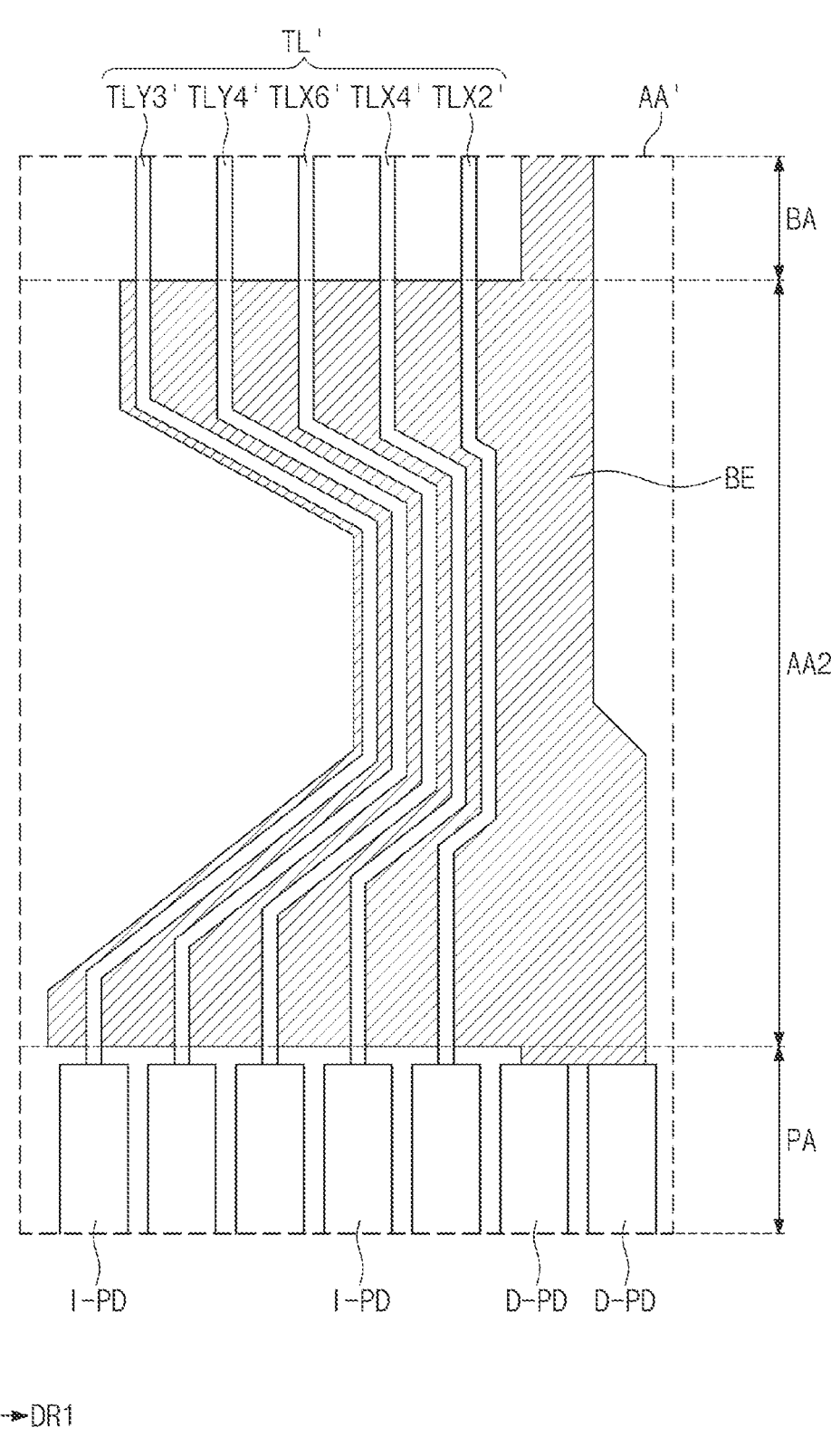
FIG. 7B is an enlarged plan view of an electronic panel according to a comparative example.

FIG. 7A is an enlarged plan view of an electronic panel according to an embodiment of the inventive concept. FIG. 7B is an enlarged plan view of an electronic panel according to a comparative example. FIG. 7A is a plan view corresponding to an area AA' of FIG. 5, and FIG. 7B is a plan view illustrating a comparative example corresponding to an area AA' illustrated in FIG. 7A.

An area AA' illustrated in FIG. 7A corresponds to an area, in which the first and second sensing lines TLX2, TLX4, TLX6, TLY3, and TLY4 are disposed, of a portion of the first and second sensing lines TLX1 to TLX6, and TLY1 to TLY4 of FIG. 5. The following description with reference to FIG. 7A may be equally applied to sensing lines disposed in the bending area BA and the second base area AA2.

Referring to FIG. 7A, the sensing lines TL may extend along one direction in the bending area BA and the second base area AA2. For example, the sensing lines TL may extend along the second direction DR2 in the bending area BA and the second base area AA2. The sensing lines TL may be electrically connected to each of the sensing pads I-PD disposed in the pad area PA. The sensing lines TL may be disposed on a different layer from the sensing pads I-PD and may be electrically connected through a contact hole. However, embodiments of the inventive concept are not limited thereto, For example, according to embodiments, the sensing lines TL may be disposed on the same layer as the sensing pads I-PD to be integrally formed.

The power pattern ES may be disposed in some of the bending area BA and the second base area AA2. The power pattern ES may be electrically connected to at least one display pad D-PD. The power pattern ES may be disposed on the same layer as the display pad D-PD to be integrally formed. However, embodiments of the inventive concept are not limited thereto. For example, according to embodiments, the power pattern ES may be disposed on a layer different from that of the display pad D-PD and electrically connected through a contact hole. In the power pattern ES, the disposable area in the bending area BA and the second base area AA2 may be limited by other configurations of the circuit layer DP-CL (refer to FIG. 6) disposed on the same layer.

The shield electrode BE may overlap the power pattern ES on the bending area BA and the second base area AA2. The shield electrode BE may be disposed on the power pattern ES. The shield electrode BE disposed on the circuit layer DP-CL (refer to FIG. 6) may have a smaller limit of a disposable area compared to the power pattern ES. Accordingly, the shield electrode BE may be formed to have a larger planar area than the power pattern ES on the bending area BA and the second base area AA2.

The sensing lines TL disposed on the shield electrode BE may overlap the shield electrode BE in a plan view. That is, each of the sensing lines TL may overlap the shield electrode BE in the bending area BA and the second base area AA2. As the sensing lines TL are disposed in the area where the shield electrode BE is formed, generation of noise in the sensing lines TL may be prevented by the configurations of the circuit layer DP-CL (refer to FIG. 6) overlapping the sensing lines TL.

In addition, as the shield electrode BE has a large planar area in the bending area BA and the second base area AA2, the sensing lines TL are not limited in width in the first direction DR1 or intervals between the sensing lines TL, and may overlap the shield electrode BE. That is, the sensing lines TL may overlap the shield electrode BE in the bending area BA and the second base area AA2 without reducing the width or spacing of the sensing lines TL. Accordingly, the degree of freedom in disposition of the sensing lines TL in the bending area BA and the second base area AA2 may increase.

The sensing lines TL may have a predetermined width in the first direction DR1. For example, each of the sensing lines TL may have a width of several micrometers (μm) to several tens of micrometers in the first direction DR1. According to embodiments, as the sensing lines TL are formed to have a sufficient width in the first direction DR1, the resistance of the sensing lines TL does not increase and may be designed to have iso-resistance.

The sensing lines TL may be spaced apart from each other by a sufficient interval in the first direction DR1. For example, the sensing lines TL may be spaced apart from each other at intervals of several micrometers to tens of micrometers in the first direction DR1. As the sensing lines TL are spaced apart from each other by a sufficient distance, the precision utilized in the process of forming the sensing lines TL may not be greatly increased, and the reliability of the sensing lines TL may be increased.

Accordingly, in relation to the sensing lines TL according to an embodiment of the inventive concept, by the shield electrode BE having a predetermined area in the bending area BA and the second base area AA2, noise generated from the components of the circuit layer DP-CL (refer to FIG. 6) overlapping the sensing lines TL may be blocked, and at the same time, a degree of freedom in arrangement of the sensing lines TL may be increased. Also, as the sensing lines TL have substantial iso-resistance, the sensitivity of the sensing unit ISP (see FIG. 5) may be increased, and reliability of the sensing unit ISP (see FIG. 5) may be increased.

FIG. 7B illustrates a comparative example in which a shield electrode is not disposed on the power pattern ES in the bending area BA and the second base area AA2. The power pattern ES shown in FIG. 7B may be substantially the same as the configuration of the power pattern ES shown in FIG. 7A.

In a comparative example that does not include a shield electrode, the power pattern ES may serve as a shield electrode for the sensing lines TL': TLY3', TLY4', TLX6', TLX4', and TLX2'. In the power pattern ES, the disposable area in the bending area BA and the second base area AA2 may be limited by other configurations of the circuit layer DP-CL (refer to FIG. 6) disposed on the same layer.

The sensing lines TL' of the comparative example may overlap the power pattern ES, which may prevent noise generated in the sensing lines TL', or reduce the noise generated in the sensing lines TL'. For example, in the second base area AA2 where the encapsulation layer ECL (see FIG. 6) is not disposed, and is thus vulnerable to noise, the sensing lines TL' may overlap the power pattern ES.

However, as the formation area of the power pattern ES in the second base area AA2 is limited, the area in which the sensing lines TL' may overlap the power pattern ES may be limited. That is, the degree of freedom of arrangement of the sensing lines TL' according to the comparative example may be reduced in the bending area BA and the second base area AA2.

The sensing lines TL' of the comparative example may have a reduced width in the first direction DR1 so as to overlap the power pattern ES. As a result, resistance of the sensing lines TL' of the comparative example may be increased. In addition, the sensing lines TL' of the comparative example may include a bent portion in a plan view in order to be formed to correspond to the shape of the power pattern ES, and as a result, resistance of the sensing lines TL' may be increased, and precision and process difficulty of a forming process may be increased. In addition, a difference in length between the sensing lines TL' of the comparative example may increase in the extension direction, and thus, a difference in resistance between the sensing lines TL' may occur.

Even if a portion of the sensing lines TL of an embodiment according to FIG. 7A does not overlap the power pattern ES, noise transmitted from other signal lines may be shielded by the shield electrode BE. However, in the comparative example of FIG. 7B in which the shield electrode is not disposed, when the sensing lines TL' are arranged such that they do not overlap the power pattern ES, noise may be generated in the sensing lines TL', and reliability may be reduced, and when the sensing lines TL' are placed to overlap the power pattern ES, the arrangement area of the sensing lines TL' is limited, so that the resistance of the sensing lines TL' may increase or a difference in resistance may occur between the sensing lines TL'.

The shield electrode according to an embodiment may prevent noise from being generated in the sensing lines connected to the sensing unit by the signal lines connected to the electronic element or the display unit, and at the same time, sufficiently secure an area in which the sensing lines are disposed. Accordingly, the sensing lines may be arranged to have an iso-resistance. Therefore, the sensing unit of the electronic apparatus may have increased sensitivity and reliability due to the shield electrode.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. An electronic apparatus comprising:
a base substrate including a first base area, a bending area, a second base area, and a pad area arranged in one direction;
a plurality of pixels disposed in the first base area, each pixel including a transistor and a light emitting element;
an encapsulation layer covering the light emitting element and spaced apart from the bending area and the second base area;
a plurality of sensing electrodes disposed on the encapsulation layer;
a plurality of sensing lines, wherein each sensing line is electrically connected to one of the sensing electrodes; and
a shield electrode disposed on a same layer as the light emitting element and extending from the first base area toward the second base area,
wherein the shield electrode overlaps the sensing lines in the bending area and the second base area.

2. The electronic apparatus of claim 1, wherein the light emitting element comprises a first electrode, a second electrode disposed on the first electrode, and a light emitting layer disposed between the first electrode and the second electrode,
wherein the shield electrode comprises a same material as the first electrode or the second electrode.

3. The electronic apparatus of claim 2, wherein the shield electrode is disposed on the same layer as the first electrode.

4. The electronic apparatus of claim 3, wherein the shield electrode is connected to the second electrode in the first base area.

5. The electronic apparatus of claim 2, wherein the shield electrode is formed integrally with the second electrode.

6. The electronic apparatus of claim 1, further comprising:
a plurality of signal lines electrically connected to the pixels,
wherein, in a thickness direction of the electronic apparatus, the sensing lines are spaced apart from the signal lines with the shield electrode disposed therebetween.

7. The electronic apparatus of claim 1, further comprising:
a power pattern disposed under the shield electrode and electrically connected to the pixels,
wherein the power pattern provides a voltage to the pixels.

8. The electronic apparatus of claim 7, wherein the shield electrode is in contact with the power pattern in the first base area.

9. The electronic apparatus of claim 7, wherein a planar area of the shield electrode is larger than a planar area of the power pattern in the second base area.

10. The electronic apparatus of claim 7, wherein at least one of the sensing lines does not overlap the power pattern in a plan view.

11. The electronic apparatus of claim 7, further comprising:
a plurality of sensing pads disposed in the pad area, wherein each sensing pad is connected to one of the sensing lines,
wherein the sensing pads are disposed on a same layer as the power pattern.

12. The electronic apparatus of claim 11, further comprising:
a circuit board disposed in the pad area and electrically connected to the sensing pads.

13. The electronic apparatus of claim 1, further comprising:
an insulating layer in contact with the encapsulation layer and the sensing electrodes,
wherein, in a thickness direction of the electronic apparatus, the sensing lines are spaced apart from the shield electrode with the insulating layer disposed therebetween.

14. The electronic apparatus of claim 1, wherein the encapsulation layer comprises:
a first inorganic film disposed on the light emitting element;
an organic film disposed on the first inorganic film; and
a second inorganic film disposed on the organic film,
wherein an end of the organic film is spaced apart from the bending area.

15. The electronic apparatus of claim 14, further comprising:
a dam disposed in the first base area,
wherein, in a plan view, the organic film is spaced apart from the bending area with the dam disposed therebetween.

16. The electronic apparatus of claim 1, wherein the bending area is bent around a bending axis extending along a direction crossing the one direction,
wherein the first base area overlaps the second base area in a plan view.

17. An electronic apparatus, comprising:
a display unit configured to display an image; and
a sensing unit disposed on the display unit and configured to sense an external input,
wherein the display unit comprises:
a base substrate including a first base area, a second base area overlapping the first base area in a plan view, and a bending area disposed between the first base area and the second base area;
a light emitting element disposed in the first base area and including a first electrode, a light emitting layer, and a second electrode;
an encapsulation layer covering the light emitting element;
a shield electrode disposed on a same layer as the first electrode or the second electrode; and
a power pattern disposed under the shield electrode and electrically connected to the second electrode,
wherein the power pattern provides a voltage to the second electrode, wherein the sensing unit comprises at least one conductive layer disposed on the encapsulation layer and including a plurality of sensing electrodes and a plurality of sensing lines, wherein the sensing lines overlap the shield electrode in the second base area, wherein a planar area of the shield electrode is larger than a planar area of the power pattern in the second base area.

18. The electronic apparatus of claim 17, further comprising:

a detection unit, wherein the detection unit comprises:

a base layer in contact with the encapsulation layer;

a first conductive layer disposed on the base layer;

a sensing insulating layer disposed on the first conductive layer; and a second conductive layer disposed on the sensing insulating layer, wherein the second conductive layer comprises the sensing lines.

19. The electronic apparatus of claim 17, wherein the shield electrode is connected to the second electrode in the first base area.

20. The electronic apparatus of claim 17, wherein the encapsulation layer comprises:

a first inorganic film disposed on the light emitting element;

an organic film disposed on the first inorganic film; and a second inorganic film disposed on the organic film, wherein each of the first inorganic film, the organic film, and the second inorganic film is spaced apart from the bending area and the second base area.

* * * * *